United States Patent [19]
Diepers et al.

[11] Patent Number: 4,577,108
[45] Date of Patent: Mar. 18, 1986

[54] X-RAY CONVERTER FOIL

[75] Inventors: Heinrich Diepers, Höchstadt; Ingmar Feigt, Langensendelbach; Gottfried Lange, Erlangen, all of Fed. Rep. of Germany

[73] Assignee: Siemens Aktiengesellschaft, Munich, Fed. Rep. of Germany

[21] Appl. No.: 675,223

[22] Filed: Nov. 27, 1984

[30] Foreign Application Priority Data

Dec. 22, 1983 [DE] Fed. Rep. of Germany ....... 3346477

[51] Int. Cl.$^4$ .............................................. G01T 1/22
[52] U.S. Cl. ................................ 250/370; 250/484.1; 250/213 R
[58] Field of Search ....... 250/370 R, 370 G, 370 GY, 250/370 J, 370 K, 213 R, 484.1, 336.1

[56] References Cited

U.S. PATENT DOCUMENTS 4,176,275  11/1979  Korn et al. ..................... 250/213 R
4,369,369  1/1983   Heidrich et al. ................ 250/484.1

OTHER PUBLICATIONS

W. Seelentag, "Elektroradiografie," *Physik in unserer Zeit*, vol. 10, 1979, No. 4, pp. 101 to 113.

Primary Examiner—Janice A. Howell
Attorney, Agent, or Firm—Kenyon & Kenyon

[57] ABSTRACT

An X-ray converter foil comprises a semiconductor layer and a carrier layer between which an electrode in the form of a conductive foil is disposed, the thickness of the semiconductor layer being less than 50 μm. An X-ray amplification layer is attached to the carrier layer.

22 Claims, 3 Drawing Figures

X-RAY CONVERTER FOIL

BACKGROUND OF THE INVENTION

The present invention relates to a device for detecting the intensity distribution of X-rays over a two-dimensional area. More particularly, the invention relates to such a device comprising an X-ray converter foil with a semiconductor layer and a carrier layer.

In X-ray diagnostics, the X-ray detection and recording system must be capable of making visible to the radiologist the biological structures relevant to the diagnostic process. Because even a very small amount of radiation can damage an organism, the radiation exposure of the patient must be minimized as much as possible. Improved picture quality, however, generally requires increased radiation exposure. In addition to maximizing detection while minimizing exposure, the X-ray recording system must also be suitable for clinical routine operation, i.e., it should be easy to handle and reliable.

An X-ray image which contains information about an irradiated object is made visible for the human eye generally by means of a device which converts incoming X-rays into a two-dimensional image, e.g., by the exposure of a film and/or the generation of fluorescent radiation. Currently, the direct exposure of X-ray sensitive film by X-rays is used in only a few examinations in medical radiology, since the lower quantum yield of the film requires a high radiation exposure of the patient. More frequently, the X-ray pictures are made by means of a sandwich of two so-called amplifier foils with X-ray film placed therebetween, the use of this foil sandwich being known as the screen-film technique. In this technique, the film is exposed mostly indirectly via fluorescent light emitted by the amplifier foils. The amplifier foils increase the quantum yield due to their higher density and the heavy atoms contained therein.

An X-ray recording system designated the XEROX-125-System uses a carrier plate or foil consisting of aluminum on which is vapor-deposited the semiconductor selenium. For sensitivity reasons, the selenium layer frequently has a thickness of at least 135 $\mu$m. This X-ray converter foil is charged by a positively charged wire which is stretched parallel to the surface of the selenium layer and at which a corona discharge burns, the charging process occurring in the absence of electromagnetic radiation including optical, X-ray and ultraviolet frequencies. The selenium layer is charged to a uniformly positive potential of, for example, 1,000 V. The X-ray converter foil is placed in a cassette for exposure to X-rays arriving in a two dimensional intensity distribution. The rays passing through the object induce photoconductivity in the selenium, whereby part of the surface charge on the selenium layer can flow to the aluminum carrier plate. A latent electrostatic image remains at the surface of the selenium layer, which electrostatic image corresponds to the X-ray image. (W. Seelentag, "Elektroradiografie," *Physik in unserer Zeit*, Vol. 10, 1979, No. 4, pages 101 to 113).

The latent electrostatic image can be made visible on paper with a dry powder or by a powder and liquid development process, such as that used in conventional photo copiers, or can be detected by means of a potential probe and reproduced on a monitor. Because the surface of the X-ray converter plate is generally charged up to a potential of several thousand volts, the diameter of the potential probe and the distance of the potential probe from the surface of the X-ray converter plate have predetermined minimum values which are determined in part by the dielectric strength of air. In addition, the quantum yield of an X-ray converter foil having a layer of selenium on an aluminum carrier plate is small and requires a relatively high radiation exposure.

An object of the invention to provide an X-ray converter foil having a substantially increased quantum yield whereby the radiation exposure of the patient can be decreased and whereby the loss of local resolution in the transmission or the read-out of the latent electrostatic image is reduced.

SUMMARY OF THE INVENTION

In accordance with the invention, an electrode in the form of an electrically conductive foil is disposed between a semiconductor layer and a carrier layer. In addition, a side of the carrier layer preferably facing away from the conductive foil is provided with an X-ray amplifier foil. The semiconductor layer, the conductive layer, the carrier layer, and the X-ray amplifier foil are firmly attached to each other, e.g., by cement. Furthermore, the thickness of the semiconductor layer may be as large as 50 $\mu$m, but preferably is at most 20 $\mu$m and, in particular, more than 5 $\mu$m.

Owing to the fact that the thickness of the semiconductor layer of the X-ray converter device is substantially smaller than the thickness of the semiconductor layer in known arrangements, the surface potential can be reduced. The surface of the semiconductor layer facing away from the conducting foil is provided with a low density surface charge by means of a corona discharge, whereby the semiconductor layer is charged to a relatively low potential. The surface potential, compared to the potential required in prior X-ray converter devices, may be reduced by an order of magnitude. This reduction enables the use of X-ray amplifier foils which are not sufficiently voltage-proof at the high voltages present in the prior devices. Using an X-ray amplifier foil is advantageous because it results in a substantially higher quantum yield of the X-ray image converter device without increasing the amount of radiation.

In an X-ray converter device according to the present invention, the distance between a potential probe and the surface of the semiconductor layer can be reduced considerably because of the lower surface potential. The distance of the potential probe from the surface of X-ray converter foil may be as small as 10 $\mu$m because of the prevailing field strength of, for instance, $10^5$ V/cm. The diameter of the potential probe itself can also be reduced since in the case of lower surface potentials, smaller geometric dimensions of the probe do not lead to electrical breakdown. A smaller probe size increases local resolution when the latent charge image is read out, and the reduced distance of the potential probe from the surface of the X-ray converter foil results in a higher signal-to-noise ratio. By using an X-ray converter foil according to the present invention, arranged in a cassette for routine clinical operation, the radiologist obtains an X-ray recording system with substantially improved image quality, the radiation exposure of the patient being reduced at the same time.

DETAILED DESCRIPTION

Figure 1:
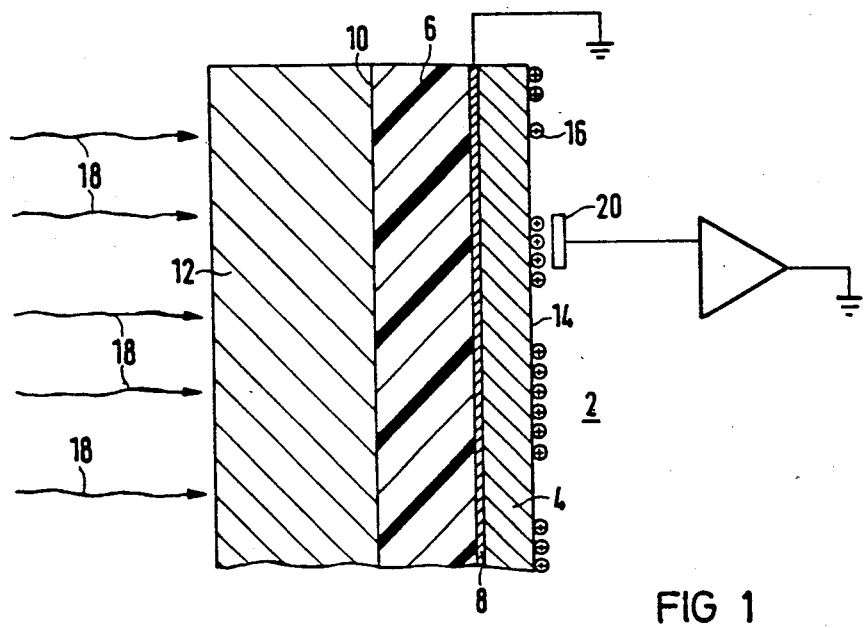
FIG. 1 is a cross-sectional veiw of an X-ray converter foil according to the present invention.

As illustrated in FIG. 1, an X-ray converter device 2 in accordance with the invention comprises an electrode in the form of a conductive foil 8 arranged between a semiconductor layer 4 and a carrier layer or plate 6. A flat side or planar surface 10 of carrier layer 6 facing away from electrically conductive foil 8 is provided with an X-ray amplifier foil or an X-ray amplification layer 12. On a flat side 14 of semiconductor layer 4, opposite conductive foil 8, a surface charge is applied by means of a corona discharge.

Semiconductor layer 4 is a photo-conductive substance with a storage capability, such as selenium, and preferably bismuth germanium oxide or trinitrofluorenonepolyvinyl carbazol. The storage time of these photoconductive substances is approximately 30 minutes.

The thickness of semiconductor layer 4 is less than 50 μm, preferably no greater than 20 μm and ideally about 5 μm, whereby the applied surface potentials are accordingly low and may be only 50 volts when the thickness of the semiconductor layer 4 is 5 μm.

Conductive foil 8 may be a very thin metal layer and preferably consists essentially of indium-tin oxide. The thickness of conductive foil 8 is, for example, several hundred Angstroms. The foil serves as a counter-electrode to the surface charge of semiconductor layer 4.

Carrier layer 6 and conductive foil 8 are optically transparent and the thickness of carrier layer 6 may be several micrometers but is at most 10 μm. Carrier layer 6 may consist essentially of a plastic and is preferably a polyimide (capton). Preferably, X-ray amplifier foil 12 consists essentially of lanthanum oxide bromide (LaOBr) or barium fluorochloride (BaFCl).

During a manufacturing process, X-ray amplifier foil 12 is brought into contact with, and preferably cemented to, a sheet consisting of semiconductor layer 4, carrier layer 6 and conductive foil 8. In this way a surface charge image 16 is not affected by friction or forces arising in a pressure contact.

Figure 3:
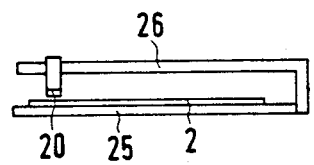
FIG. 3 is an elevation view of the X-ray converter foil of FIG. 1 or 2 on a support plate.

X-rays 18 passing through an irradiated object are converted in the X-ray amplifier foil 12 into photons, each X-ray quantum generating several photons. These photons travel to the semiconductor layer 4 through the optically transparent carrier layer 6 and the conductive foil 8, which is so thin as to be optically transparent. In the surface region on the side of semiconductor layer 4 opposite the charged surface thereof, the photons generate holes and electrons. The electrons, which have absorbed the incoming photons, flow to the opposite side of the semiconductor layer and neutralize the surface charge there. The surface charge distribution 16 generated in this manner is a latent image of the object to be examined. The surface charge density distribution 16 is scanned by potential probe 20. To this end, X-ray image converter foil 2 is arranged on a disc-shaped plate 25 (see FIG. 3) which is provided with a support arm 26 to which potential probe 20 is shiftably mounted. So that the X-ray converter foil 2 is easy to handle and is suitable for routine clinical operations, the converter foil 2 is advantageously arranged in a cassette plug-in unit (not shown).

Figure 2:
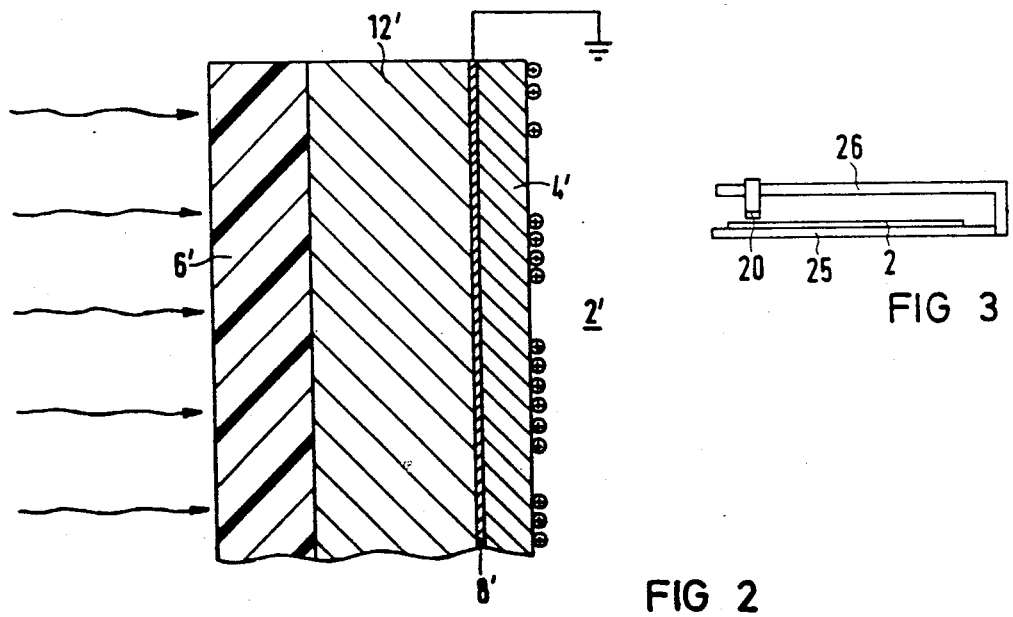
FIG. 2 is a cross-sectional view of a further embodiment of the X-ray converter foil.

As illustrated in FIG. 2, an X-ray converter device 2' has an X-ray amplification foil 12' arranged between a conductive foil 8' and a carrier foil 6'. Thus, a semiconductor layer 4' with conductive foil 8' directly contacts X-ray amplification foil 12'. With this arrangement, no particles of dust or the like can be deposited between X-ray amplification foil 12' and semiconductor layer 4' during a fabrication process, which particles would generate so-called image artifacts. Uncontrolled charges due to the separation of insulating surfaces with different property are avoided. Such uncontrolled charges would result in image erasure or dynamics and resolution losses.

Although the invention has been described in terms of specific embodiments and applications, one of ordinary skill in the art, in the light of this teaching, can generate additional embodiments without departing from the spirit or exceeding the scope of the claimed invention. Accordingly, it is to be understood that the drawings and descriptions in this disclosure are proferred to facilitate comprehension of the invention and should not be construed to limit the scope thereof.

What is claimed is:

1. An X-ray converter device in the form of a substantially planar sheet for detecting the intensity distribution of X-rays over a two-dimensional region, comprising:
   a semiconductor layer having a thickness less than 50 μm;
   an electrode in the form of an electically conductive foil attached to one face of said semiconductor layer; and
   a layer attached to said conductive foil on a side thereof opposite said semiconductor layer, said layer including a carrier layer and an X-ray amplification layer.

2. An X-ray converter device as defined in claim 1 wherein said carrier layer is arranged between said conductive foil and said X-ray amplification layer.

3. An X-ray converter device as defined in claim 1, wherein said X-ray amplification layer is arranged between said carrier layer and said conductive foil.

4. An X-ray converter device as defined in claim 2 or 3 wherein the thickness of said semiconductor layer is at most approximately 20 μm.

5. An X-ray converter device as defined in claim 3 wherein said conductive foil is connected to said semiconductor layer over a large area and wherein said amplification layer is connected to said conductive foil as well as to said carrier layer over a large area.

6. An X-ray converter device as defined in claim 2 or 3 wherein said semiconductor layer consists essentially of selenium.

7. An X-ray converter device as defined in claim 2 or 3 wherein said semiconductor layer consists essentiallly of bismuth-germanium oxide.

8. An X-ray converter device as defined in claim 2 or 3 wherein said semiconductor layer consists essentially of trinitrofluorenone polyvinyl carbazol.

9. An X-ray converter device as defined in claim 2 or 3 wherein said conductive foil is optically transparent.

10. An X-ray converter device as defined in claim 9 wherein said conductive foil has a thickness no greater than approximately 10 nm.

11. An X-ray converter device as defined in claim 10 wherein said conductive foil consists essentially of gold.

12. An X-ray converter device as defined in claim 10 wherein said conductive foil consists essentially of indium-tin oxide.

13. An X-ray converter device as defined in claim 1 wherein said conductive foil consists essentially of gold.

14. An X-ray converter device as defined in claim 1 wherein said conductive foil consists essentially of indiumtin oxide.

15. An X-ray converter device as defined in claim 2 wherein said carrier layer is optically transparent.

16. An X-ray converter device as defined in claim 2, 3 or 15 wherein said carrier layer has a thickness greater than 3 μm and less than 10 μm.

17. An X-ray converter device as defined in claim 2, 3 or 15 wherein said carrier layer consists essentially of a plastic material.

18. An X-ray converter device as defined in claim 2, 3 or 15 wherein said carrier layer consists essentially of a polyimide.

19. An X-ray converter device as defined in claim 2 or 3 wherein said semiconductor layer is provided on another face opposite said one face with a surface charge by means of a corona discharge.

20. An X-ray converter device as defined in claim 19 wherein said surface charge produces a surface potential of at least 50 volts.

21. An X-ray converter device as defined in claim 2 or 3, further comprising means including a potential probe for scanning a surface charge distribution on a face of said semiconductor layer opposite said conductive foil.

22. An X-ray converter device as defined in claim 21, further comprising a support plate and a support bar mounted thereto, said potential probe being shiftably mounted to said support bar, said support plate serving to carry the planar sheet comprising said semiconductor layer, said conductive foil said carrier layer and said X-ray amplification layer.

* * * * *